United States Patent [19]
Gill et al.

[11] Patent Number: 5,770,868
[45] Date of Patent: Jun. 23, 1998

[54] GAAS SUBSTRATE WITH COMPOSITIONALLY GRADED ALGAASSB BUFFER FOR FABRICATION OF HIGH-INDIUM FETS

[75] Inventors: David Michael Gill, Pasadena; Parvez Nasir Uppal, Laurel, both of Md.

[73] Assignee: Martin Marietta Corporation, Bethesda, Md.

[21] Appl. No.: 555,027

[22] Filed: Nov. 8, 1995

[51] Int. Cl.$^6$ .................................................. H01L 29/205
[52] U.S. Cl. .......................................... 257/190; 257/191
[58] Field of Search ................................... 257/190, 191; 437/112, 128, 969, 976; 438/478, 938

[56] References Cited

U.S. PATENT DOCUMENTS

| | | | |
|---|---|---|---|
| 4,195,305 | 3/1980 | Moon ....................................... | 257/191 |
| 4,378,259 | 3/1983 | Hasegawa et al. ...................... | 148/175 |
| 4,963,949 | 10/1990 | Wanlass et al. ......................... | 254/190 |
| 5,060,028 | 10/1991 | Kuo et al. ................................ | 257/191 |

FOREIGN PATENT DOCUMENTS 9217908  3/1992  European Pat. Off. .

OTHER PUBLICATIONS

S. M. Sze, "Physics of Semiconductor Devices," 1981, p. 706.

"First High Performance InAlAs/InGaAs HEMTs on GaAs Exceeding that on InP", IEEE IEDM 94–891–894, Conf. Proceedings paper, pp. 36.1.1–36.1.4, Higuchi et al.

"InGa$_{0.5}$As/InAlAs Modulated–doped Field Effect Transistors on GaAs Substrates Grown by Low–Temperature Molecular Beam Epitaxy", Japanese Journal of Applied Physics; vol. 30, No. 12B, Dec. 1991, pp.3850–3852, Masato et al.

"Lattice–Mismatched InGaAs/InAlAs Modulated–Doped Field–Effect Transistors on GaAs: Molecular–Beam Epitaxial Growth and Device Performance", Journal of Applied Physics; vol. 67, No. 7, Apr. 1990, pp. 3323–3327, Chang et al.

"Lattice–Mismatched Growth and Transport Properties of InAlAs/InGaAs Heterostructures on GaAs Substrates", Japanese Journal of Applied Physics, vol. 28, No. 7, Jul. 1989, pp. L1101–L1103, Harmand et al.

"Heteroepitaxy of InGaAs On GaAs Substrates with InAlAs Intermediate Layer", Journal of Crystal Growth, vol. 93, 1988, pp. 517–522, Udea et al.

"A 0.1–um Gate AlInAs/GaInAs MODFET Fabricated on GaAs Substrates", IEEE Transactions on Electron Devices, vol. 35, No. 7, Jul. 1988, pp. 818–823, Wang et al.

*Primary Examiner*—Jerome Jackson
*Assistant Examiner*—John Guay
*Attorney, Agent, or Firm*—W. H. Meise; D. W. Gomes; S. A. Young

[57] ABSTRACT

Semiconductor devices made in highindium-content semiconductor material have advantageous properties, but similar substrate materials are hard to handle. A buffer layer makes a lattice-constant transition between a GaAs substrate and a high-indium epitaxially deposited semiconductor such as those lattice-matched to InP. The buffer layer is an epitaxial layer including atoms of two Group III elements, and atoms of two Group V elements, with the ratio of the atoms of at least one group varied along the depth of the buffer layer, in a manner which makes a transition of the lattice constant between that of the substrate and the high-Indium semiconductor material. The Group III elements are gallium and aluminum, and the Group V elements are arsenic and antimony.

7 Claims, 2 Drawing Sheets

GAAS SUBSTRATE WITH COMPOSITIONALLY GRADED ALGAASSB BUFFER FOR FABRICATION OF HIGH-INDIUM FETS

FIELD OF THE INVENTION

This invention relates to substrate and buffer compositions for fabrication of semiconductor devices, and more particularly to GaAs substrates with compositionally graded buffer layers for matching lattice constants with high-indium semiconductor materials in which semiconductor devices, such as FETS, may be formed.

BACKGROUND OF THE INVENTION

Field-effect transistors which are made using indium-based materials tend to outperform those based upon gallium arsenide (GaAs), in that they have lower effective electron mass, higher conduction band discontinuity ($\Delta Ec$), and possibly for other reasons. However, fabrication and processing of indium-containing wafer substrates, such as InP, is more difficult than the processing of GaAs. There is therefore a need for some method to form or grow semiconductors, and more particularly field-effect transistors, on a gallium arsenide substrate.

The major difficulty in making highindium content semiconductors on a GaAs substrate lies in the differences in the crystal lattice constant. In general, the lattice constant of an indium-based material is larger than that of GaAs. Formation of indium-based materials directly on GaAs, some way must be provided to relieve the strains which result from the lattice mismatch, otherwise dislocations may occur in the semiconductor material which tend to degrade performance or reduce yield. In the past, strain-relieving buffer layers have been used, such as, for example, the AlGaAsSb layer a few tens of atoms thick placed between a GaAs or Si substrate and an InAs active or channel layer, described in European Patent Application publication number W092/17908(15.10.92/26), invented by Shibasaki.

U.S. Pat. No. 4,963,949, issued Oct. 16, 1990 in the name of Wanlass et al. describes InP-based semiconductor separated from a GaAs substrate material by a compositionally graded intermediate layer of GaInP, GaInAs, or GaInSb for lattice matching, sandwiched between two dislocation blocking layers such as a superlattice, thermally annealed layer, thermally cycled or heavily doped layer. This arrangement requires a great deal of processing for the dislocation blocking layers. Improved compositions, layered arrangements of compositions, and methods of manufacture of semiconductor devices are desired.

SUMMARY OF THE INVENTION

A semiconductor device is grown on a substrate, and includes a gallium arsenide (GaAs) substrate or layer defining a first lattice constant. An indium-containing semiconductor material is associated with the semiconductor device. The indium-containing semiconductor material may be InP, InAs, InGaAs, InAlAs, or InAsP. The indium-containing material is ultimately supported by the gallium arsenide substrate, and has a second lattice constant different from the first lattice constant. The device also includes a metamorphic buffer layer lying between the gallium arsenide substrate and the indium-containing material. The buffer layer comprises or consists essentially of intermingled first and second Group III elements and first and second Group V elements, with the ratio of the first and second Group V elements having a gradation which changes the lattice constant, with the gradation extending from the lattice constant of the gallium arsenide substrate to that of the indium-containing material. In a particular embodiment of the invention, the first and second Group V elements are antimony and arsenic, respectively. In another embodiment of the invention, the first and second Group III elements consist essentially of aluminum and gallium. According to an aspect of the invention, the ratio is the ratio of antimony to arsenic, and the ratio includes a smaller proportion of antimony to arsenic in portions of the buffer layer adjacent the gallium arsenide substrate than at portions of the buffer layer remote from the gallium arsenide substrate. In a particular embodiment, the relative mole fractions of the aluminum and gallium are substantially equal throughout the buffer layer, and the mole fraction of the arsenic and antimony changes as a function of distance from the gallium arsenide substrate, as a result of a change in the As:Sb ratio. In a particular embodiment, the change in the As:Sb ratio results in a change in lattice constant of about 10% for every 1000 Å of the buffer layer, and the desired lattice constant is achieved when the compositionally graded buffer layer is about 1 $\mu$m thick. After the compositionally graded material is deposited, an additional thickness of about 1$\mu$m may be grown with a constant As:Sb ratio and at the desired lattice constant for the highindium semiconductor layer, to provide about 2 $\mu$m total thickness. In another embodiment of the invention, the ratio of the aluminum and gallium components vary across the thickness of the buffer layer, instead of the ratio of the arsenic to the antimony.

A method for making a semiconductor device according to the invention includes the steps of forming a buffer layer by epitaxially supplying a particular flux of first and second Group III atoms to a portion of a gallium arsenide substrate on which the layer is to be grown. Simultaneously with the step of supplying a flux of Group III atoms, the further step is performed of supplying a particular flux of first and second Group V atoms to the same portion of the gallium arsenide substrate, as a result of which the buffer layer additionally includes the Group V atoms. During the step of applying a particular flux of Group V elements, the ratio of at least one of the Group V atoms to the other atoms is changed. Changing the flux of either of the Group V elements results in a metamorphic change in the lattice constant of the buffer layer. When the buffer layer is complete, a semiconductor device is formed on the exposed surface of the buffer layer. The forming of the semiconductor device includes deposition of a layer of indium-containing material over the buffer layer. The indium-containing layer may be InP, InAs, InGaAs, InAlAs, or InAsP. The Group III elements of the buffer layer, in one embodiment, are aluminum and gallium, and the Group V elements are arsenic and antimony.

DESCRIPTION OF THE INVENTION

Figure 1:
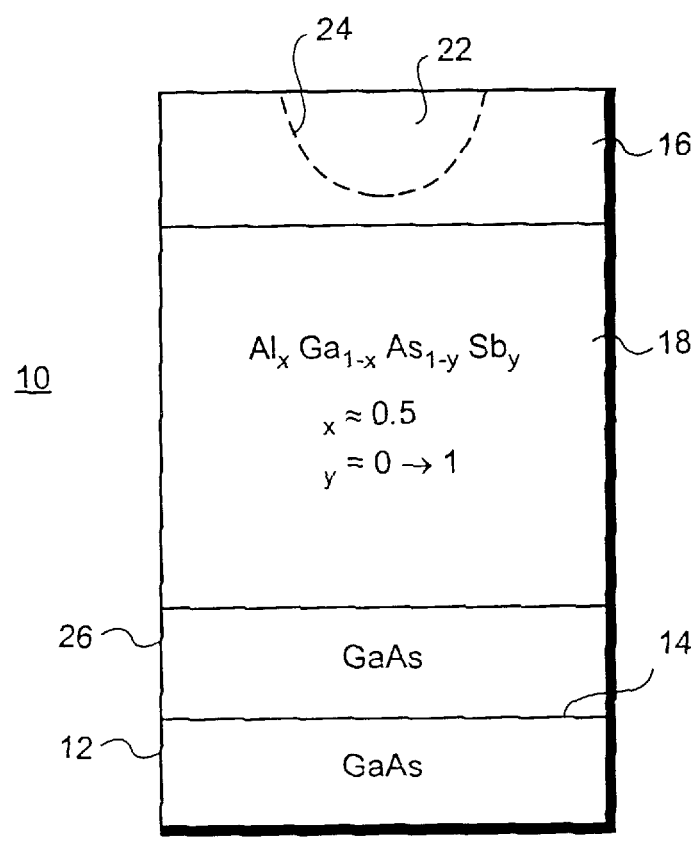
FIG. 1 is a cross-section of a substrate and an active semiconductor layer separated by a buffer layer according to the invention.

In FIG. 1, a semiconductor device designated generally as 10 includes a bulk substrate 12 which has at least an upper surface layer 14 of essentially nonconductive GaAs (gallium arsenide). In order to cover undesired surface states of the GaAs substrate at surface 14, a layer 26 of undoped GaAs is deposited on surface 14, to provide a more consistent surface for further layers. In essence, the "substrate" consists of the combination of bulk substrate 12 and substrate-covering layer 26.

An indium-containing deposited semiconductor base material 16 is supported by a buffer layer 18 of FIG. 1, and is ultimately supported by bulk substrate 12. Semiconductor base material 16 consists essentially of $In_xGa_{1-x}As$ (Indium Gallium Arsenide), $In_xAl_{1-x}As$ (Indium Aluminum Arsenide), or $InAs_xP_{1-x}$ (Indium Arsenic Phosphide). Layer 16 may be processed in known fashion to produce a semiconductor device illustrated as a region 22, identified by a dash line 24, which has some improved characteristics over a similar device formed in GaAs.

In accordance with an aspect of the invention, buffer layer 18 of FIG. 1 is a compositionally graded lattice matching material, which matches the lattice constants of the substrate 12, 26 to that of the high-indium semiconductor base material. Buffer layer 18 is deposited on substrate 12, 26 before deposition of the high-indium semiconductor base material. Buffer layer 18 includes first and second Group III elements and first and second Group V elements, with at least one of the elements varying in concentration or mole fraction as a function of distance from the GaAs substrate.

In accordance with another aspect of the invention, the Group III elements are Al (aluminum) and Ga (gallium), and the Group V elements are As (arsenic) and Sb (antimony). In a preferred embodiment of the invention, the flux of the Group III elements and of the antimony of the buffer layer are held constant as a function of the thickness of the buffer layer, and the flux of As is varied as a function of the thickness of the buffer layer, thereby resulting in a change in the ratio of Group V atoms and a change in the lattice constant. The mole fraction of As is varied in such a way as to provide about a 10% change in the lattice constant for every 1000 Å of thickness of the layer, until the desired lattice constant is obtained. The compositionally graded buffer layer in one embodiment has a thickness of about 10,000 Å. thickness. The function by which the ratio changes may be linear with the thickness of the lattice transition portion of the buffer layer.

Buffer layer 18 advantageously has dislocation blocking characteristics, so no separate dislocation blocking layers are needed to prevent the threading of dislocations.

As one specific example of a buffer layer, the buffer layer 18 of FIG. 1 is of $Al_xGa_{1-x}As_{1-y}Sb_y$, where X is maintained at a value of 0.5 throughout the thickness of the graded portion of the buffer layer 18, and the value of Y is changed more or less linearly as a function of thickness from zero to 1. This, of course, maintains the mole fraction of Al and Ga unchanged with thickness, and changes the mole fraction of As from (As=1.0) to (As=0.0) as the distance from surface of the GaAs substrate 12, 26 increases.

Figure 2:
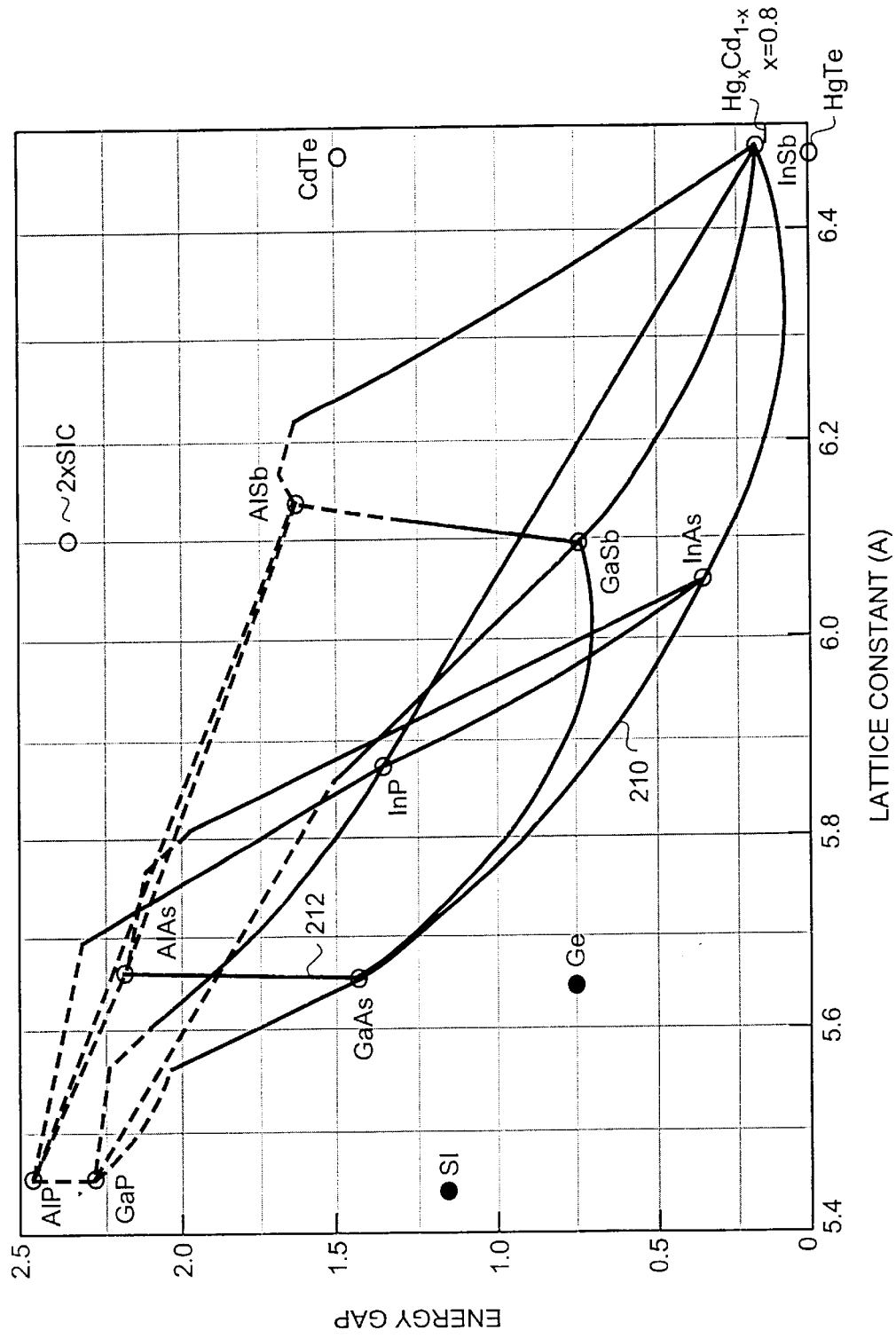
FIG. 2 plots bandgap versus lattice constant for various materials.

FIG. 2 is a plot of bandgap versus lattice constant for some Group III-V compound semiconductors. Solid lines in FIG. 2 represent direct bandgap materials, while dash lines represent indirect bandgap materials. The GaAs point represents a bandgap of about 1.4 eV and a lattice constant of about 5.65 Å. The InAs point represents 0.4 eV and 6.07 Å. The solid line 210 connecting the GaAs and InAs points represents a ternary of InGaAs. The line 212 extending from the GaAs point to AlAs also represents a ternary compound.

Other embodiments of the invention will be apparent to those skilled in the art. For example, while the described embodiments describe changing the aluminum/gallium mole ratio or the arsenic/antimony mole ratio, they may both be varied across the buffer layer to provide the desired lattice constant change. While a linear change of X or Y as a function of buffer layer thickness has been described, the function may be quadratic, cubic, or of any other mathematical function.

What is claimed is:

1. A semiconductor device grown on a substrate said semiconductor device comprising:

a gallium arsenide substrate having a crystalline structure defining a first lattice constant, an indium-containing semiconductor material associated with said semiconductor device, said indium-containing material being ultimately supported by said gallium arsenide substrate, and having a second lattice constant different from said first lattice constant, and a metamorphic buffer layer lying between said gallium arsenide substrate and said indium-containing material, said buffer layer comprising intermingled atoms of first and second Group III elements and atoms of first and second Group V elements, with the ratio of said atoms of one of said Group III and Group V elements having a gradation extending through said buffer layer, in a manner which makes a transition between said first and second lattice constants, said first and second Group V elements being arsenic and antimony, respectively, said first and second Group III elements being aluminum and gallium, respectively, and wherein said ratio is the ratio of arsenic to antimony, and said ratio includes a smaller proportion of antimony to arsenic in portions of said buffer layer adjacent said gallium arsenide substrate than at portions of said buffer layer remote from said gallium arsenide substrate; and wherein the relative mole fraction of said aluminum and gallium is substantially equal throughout said buffer layer, and the mole fraction of said arsenic and said antimony changes relative as a function of distance from said gallium arsenide substrate.

2. A semiconductor device grown on a substrate, said semiconductor device comprising:

a gallium arsenide substrate having a crystalline structure defining a first lattice constant;

an indium-containing semiconductor material associated with said semiconductor device, said indium-containing material being ultimately supported by said gallium arsenide substrate, and having a second lattice constant different from said first lattice constant;

a metamorphic buffer layer lying between said gallium arsenide substrate and said indium-containing material said buffer layer comprising intermingled atoms of first and second Group III elements and atoms of first and second Group V elements, wherein said first and second Group V elements are arsenic and antimony, respectively, and with the ratio of said atoms of one of said Group III and Group V elements having a gradation extending through said buffer layer in a manner which makes a transition between said first and second lattice constants; and wherein said mole fraction of said arsenic and antimony changes at a rate which results in about a 10% change in lattice constant in each 1000 A of thickness of said buffer layer.

3. A device according to claim 2, wherein said buffer layer includes a portion adjacent said indium-containing semiconductor which has constant mole fractions of said Group III and Group V atoms.

4. A device according to claim 2, wherein said thickness of said buffer layer is about 1 μm.

5. A semiconductor device grown on a substrate, said semiconductor device comprising:

a gallium arsenide substrate having a crystalline structure defining a first lattice constant;

an indium-containing semiconductor material associated with said semiconductor device, said indium-containing semiconductor material being ultimately supported by said gallium arsenide substrate, and having a second lattice constant different from said first lattice constant; and a metamorphic buffer layer lying between said gallium arsenide substrate and said indium-containing material, said buffer layer consisting essentially of intermingled atoms of first and second Group III elements and of first and second Group V elements, wherein said first and second Group III elements consist essentially of aluminum and gallium, and said first and second Group V elements are arsenic and antimony, respectively, with the ratio of said atoms of said first and second Group V elements having a gradation extending from said gallium arsenide substrate to said indium-containing material, and wherein the relative mole fractions of said aluminum and gallium are substantially equal throughout said buffer layer; and the mole fraction of said arsenic and said antimony changes as a function of distance from said gallium arsenide substrate.

6. A semiconductor device grown on a substrate, said semiconductor device comprising:

a gallium arsenide substrate having a crystalline structure defining a first lattice constant:

an indium-containing semiconductor material associated with said semiconductor device, said indium-containing semiconductor material being ultimately supported by said gallium arsenide substrate, and having a second lattice constant different from said first lattice constant;

a metamorphic buffer layer lying between said gallium arsenide substrate and said indium-containing material, said buffer layer consisting essentially of intermingled atoms of first and second Group III elements and of first and second Group V elements, wherein said first and second Group V elements are arsenic and antimony, respectively, with the ratio of said atoms of said first and second Group V elements having a gradation extending from said gallium arsenide substrate to said indium-containing material;

wherein said ratio of arsenic atoms to antimony atoms changes in a manner which changes the lattice constant by about 10% in each 1000 Å across said buffer layer.

7. A device according to claim 6, wherein said thickness of said buffer layer is about 10,000 Å.

\* \* \* \* \*